United States Patent

Goebel et al.

[11] Patent Number: 5,919,325
[45] Date of Patent: Jul. 6, 1999

[54] PROCESS FOR PRODUCING A CERAMIC MULTILAYER SUBSTRATE

[75] Inventors: Ulrich Goebel; Walter Roethlingshoefer, both of Reutlingen, Germany

[73] Assignee: Robert Bosch GmbH, Stuttgart, Germany

[21] Appl. No.: 08/981,163

[22] PCT Filed: Dec. 7, 1996

[86] PCT No.: PCT/DE96/02348

§ 371 Date: Dec. 11, 1997

§ 102(e) Date: Dec. 11, 1997

[87] PCT Pub. No.: WO97/40529

PCT Pub. Date: Oct. 30, 1997

[30] Foreign Application Priority Data

Apr. 20, 1996 [DE] Germany ............................ 196 15 787

[51] Int. Cl.⁶ .................................................. C04B 37/00
[52] U.S. Cl. ................................... 156/89.16; 156/89.12; 156/89.23; 264/614; 264/619; 264/620
[58] Field of Search ..................................... 264/619, 614, 264/620; 156/89.23, 89.12, 89.16

[56] References Cited

U.S. PATENT DOCUMENTS 4,345,955  8/1982  Bakemans ............................... 264/619
5,085,720  2/1992  Mikeska et al. ........................... 156/89

FOREIGN PATENT DOCUMENTS 0 050 903  5/1982  European Pat. Off. .
0 133 917  3/1985  European Pat. Off. .
43 09 005  1/1994  Germany .
64-81107   3/1989  Japan .

*Primary Examiner*—James Derrington
*Attorney, Agent, or Firm*—Kenyon & Kenyon

[57] ABSTRACT

A process for producing a ceramic multilayer substrate, particularly an LTCC substrate, in which printed circuit traces and plated contactings are produced in a printing process on a plurality of green ceramic foils using a conductive paste which contains a wax as a printing carrier and is free of highly volatile solvents, and the green ceramic foils subsequently being arranged in a stack one upon the other and fired. The otherwise customary, time-consuming drying of the green ceramic foils for the vaporization of the utilized solvent is eliminated. The foils can be stacked and fired immediately after the printing of the printed circuit traces and plated contactings. Furthermore, shrinkage of the printed circuit traces and the green ceramic foils before the firing is avoided, thereby decisively improving the precision of the produced ceramic multilayer substrates.

4 Claims, No Drawings

PROCESS FOR PRODUCING A CERAMIC MULTILAYER SUBSTRATE

FIELD OF THE INVENTION

The present invention relates a process for producing a ceramic multilayer substrate.

BACKGROUND INFORMATION

A conventional process for producing ceramic multilayer substrates is described, for example, in German Patent No. 43 09 005. In this conventional process, green ceramic foils (i.e., flexible, unfired ceramic foils in its raw state) are provided with printed circuit traces and plated contactings, also referred to as vias. In the first step of the conventional process, holes for the plated contactings are punched into the green ceramic foils. Printed circuit traces are then printed with a conductive paste on the ceramic foils using commonly known screen-printing technique. The punched holes for the vias are either filled with conductive paste during the printing of the printed circuit traces or in a printing operation carried out separately before the printing of the printed circuit traces. This method is also used for producing LTCC substrates (low temperature co-fired ceramics) which differ from other ceramic multilayer substrates in that ceramic foils are used which can already be fired at temperatures below 900° C. Given these low sintering temperatures, very inexpensive conductive pastes can be used to produce the printed circuit traces. After imprinting the ceramic foils, they are dried and arranged one upon the other in a stack. The stack thus formed is subsequently laminated and finally fired.

The conductive pastes used in the present related art for producing ceramic multilayer substrates contain organic, highly volatile solvents which partially diffuse into the green ceramic foils. Such solvents are alcohols or terpineols, for example. After the printing of the printed circuit traces or the plated contactings but before the stacking and firing of the green ceramic foils, the ceramic foils must in conventional processes be dried in a drier since the conductive paste applied on the ceramic foils cannot be baked undried into the foils, otherwise a spontaneous vaporization of the solvent, contained in the conductive paste, at the high firing temperatures of the ceramic foils would lead to the formation of cracks and bubbles in the ceramic multilayer substrates. In this context, it must be regarded as extremely disadvantageous that the drying process of the green ceramic foils represents an exceedingly costly interruption of the manufacturing process. The individual ceramic foils are dried at slightly elevated temperatures until the predominant portion of the solvent has vaporized. Furthermore, with the evaporation of the solvent from the conductive paste and the evaporation of the solvent diffused into the ceramic foils comes a disadvantageous shrinkage of the printed circuit traces and ceramic foils. Since the ceramic foils do not all shrink uniformly, distortions can occur in the pattern of the printed circuit traces on the green ceramic foils. During the stacking of the ceramic foils subsequently carried out after the drying process, misalignments and displacements between the printed circuit traces and plated contactings of two ceramic foils located one upon the other can partially or totally prevent the occurrence of an electrical contact at the desired positions. Because of this, the multilayer substrate formed after the firing becomes unusable.

SUMMARY OF THE INVENTION

The process according to the present invention has the great advantage that the green ceramic foils do not have to be dried before the stacking. Due to the use of a conductive paste which contains a wax as a printing carrier and has no highly volatile solvent, the time-consuming drying of the green ceramic foils is eliminated. Thus, the foils can be stacked and fired immediately after the printing of the printed circuit traces and plated contactings. The elimination of the drying times allows the ceramic multilayer substrates to be manufactured much more quickly. Moreover, another great advantage is, that shrinkage of the printed circuit traces and the green ceramic foils before the firing is avoided, as are distortions of the fine printed circuit trace patterns on the green ceramic foils. During stacking and firing of the ceramic foils, it is assured that electrical contacts between printed circuit traces and plated contactings of two ceramic foils arranged one upon the other are also actually formed at the desired positions. All in all, the precision of the manufactured ceramic multilayer substrate is hereby decisively improved.

DETAILED DESCRIPTION

To produce a ceramic multilayer substrate, unfired, green ceramic foils are used. The green ceramic foils are made of ceramic particles, an inorganic binder and an organic binder. Suitable materials for these components are listed, for example, in U.S. Pat. No. 5,085,720. The green ceramic foils have a flexible structure and can be easily worked. Thus, for example, the punching of holes for plated contactings (vias) is easily possible during this phase of the substrate production. After the ceramic foils have been provided with the necessary plated contacting holes, they are filled with a conductive paste during a printing operation. After that, in a further printing operation, the printed circuit traces are imprinted on the ceramic foils. During printing, a conductive paste is used as a printing carrier which contains no highly volatile solvent. The conductivity of the paste is produced by a great number of small metal particles, e.g. silver particles having a particle size of 0.5 $\mu$m–10 $\mu$m. As a printing carrier, the conductive paste contains a wax made of organic compounds that is solid to kneadable below a temperature range of approximately 40° C. to 70° C., and above this temperature range changes, without decomposing, into the highly liquid state. Particularly well suited for a preferred embodiment according to the present invention are conductive pastes consisting of a wax which changes into the liquified state at approximately 60° C. to 70° C. During the production of the printed circuit traces and the plated contactings on the green ceramic foils, the conductive paste is heated to a temperature of more than 70° C., so that the paste becomes printable and exhibits the rheological properties necessary for the printing operation. Such pastes are commercially available at present for other purposes, for example, under the description ENVIROTHERM pastes. Since the printed paste contains no highly volatile solvent, no solvent diffuses into the green ceramic foils during the printing process either. Thus, drying of the ceramic foils, which is necessary in the conventional processes to allow which the highly volatile solvents to evaporate from the conductive paste and the ceramic foils, and which is associated with shrinkage, is unnecessary in a preferred embodiment according to the present invention. After the printing of the printed circuit traces, the wax in the conductive paste solidifies after a brief cooling-off period, as a result of which the printed circuit traces are fixed in their position and dimensioning on the green ceramic foils. The green ceramic foils can now be stacked in alignment, one upon the other, without a drying step. Since the printed circuit trace pattern, which are applied with great precision on the green ceramic foils, solidifies immediately after cooling off, no additional stabilization measures have to be taken to avoid a distortion or deformation of the printed circuit trace pattern. The stack thus formed is now laminated and finally fired in an oven. During firing, the organic binding substances of the green ceramic foils are burned without leaving any residue. The actual ceramic substrate is formed during the sintering, the inorganic binder acting as a matrix through which the ceramic particles are bonded to one another. Simultaneously, the organic wax contained in the conductive paste of the applied printed circuit traces and plated contactings is pyrolyzed and escapes from the stack through the porous ceramics. And the metal particles contained in the paste become electroconductively interconnected, so that the conductor pattern of electrically connected printed circuit traces and plated contactings provided in a plurality of layers is formed.

What is claimed is:

1. A process for producing a ceramic multilayer substrate, the process comprising the steps of:

printing at least one of circuit traces and plated contactings on a plurality of green ceramic foils using a conductive paste, the conductive paste including a wax but being free of any highly volatile solvents;

after the printing step, stacking the plurality of green ceramic foils; and firing the stacked plurality of green ceramic foils.

2. The process according to claim 1, wherein the substrate is a low temperature co-fired ceramic (LTCC) substrate.

3. The process according to claim 1, wherein the wax enters a liquified state at a predetermined temperature.

4. The process according to claim 3, wherein the predetermined temperature is in a range of approximately 60° C. to 70° C.

* * * * *